United States Patent
Mise et al.

(10) Patent No.: US 6,835,665 B2
(45) Date of Patent: Dec. 28, 2004

(54) ETCHING METHOD OF HARDLY-ETCHED MATERIAL AND SEMICONDUCTOR FABRICATING METHOD AND APPARATUS USING THE METHOD

(75) Inventors: Nobuyuki Mise, Chiyoda (JP); Ken Yoshioka, Hikari (JP); Ryoji Nishio, Kudamatsu (JP); Tatehito Usui, Chiyoda (JP)

(73) Assignee: Hitachi High-Technologies Corporation, Tokyo (JP)

( * ) Notice: Subject to any disclaimer, the term of this patent is extended or adjusted under 35 U.S.C. 154(b) by 323 days.

(21) Appl. No.: 10/090,761

(22) Filed: Mar. 6, 2002

(65) Prior Publication Data
US 2003/0170998 A1 Sep. 11, 2003

(51) Int. Cl.$^7$ ............................................. H01L 21/302
(52) U.S. Cl. ...................... 438/706; 438/710; 438/717; 438/720; 216/46
(58) Field of Search ................................. 438/706, 710, 438/712, 713, 717, 745; 216/46, 58, 72

(56) References Cited

U.S. PATENT DOCUMENTS

| | | | |
|---|---|---|---|
| 5,515,984 A | * | 5/1996 | Yokoyama et al. ............ 216/41 |
| 5,818,107 A | | 10/1998 | Pierson et al. |
| 6,057,081 A | | 5/2000 | Yunogami et al. |
| 6,100,100 A | * | 8/2000 | Nagano et al. ................. 438/3 |
| 6,451,118 B1 | * | 9/2002 | Garriga ...................... 118/715 |
| 6,541,380 B2 | * | 4/2003 | Ying et al. .................. 438/689 |
| 6,596,571 B2 | * | 7/2003 | Arao et al. .................. 438/163 |

FOREIGN PATENT DOCUMENTS

| JP | A-10-223855 | 8/1998 |
|---|---|---|
| JP | A-10-214826 | 4/1999 |
| JP | A-10-98162 | 5/2000 |

* cited by examiner

Primary Examiner—Lan Vinh
(74) Attorney, Agent, or Firm—Antonelli, Terry, Stout & Kraus, LLP

(57) ABSTRACT

A film of hardly-etched material formed on a substrate is etched using a mask formed on the film of hardly-etched material and a plasma, wherein the film of hardly-etched material is etched using the mask formed with a side wall angled at 90 degrees or less with respect to the surface of the substrate, thereby forming the etched film with a taper angle to the surface of the substrate equal to or larger than the taper angle of the mask.

21 Claims, 15 Drawing Sheets

FIG.2A
FIG.2B
FIG.2C
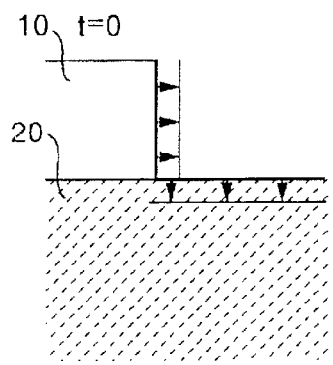
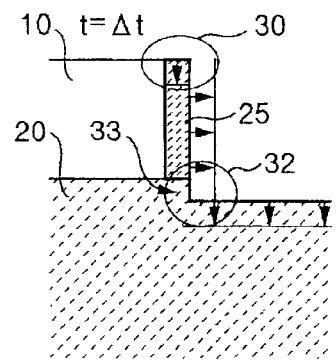
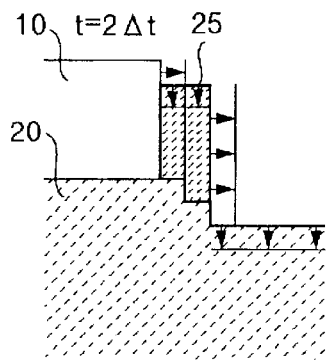
FIG.2D
FIG.2E
FIG.2F
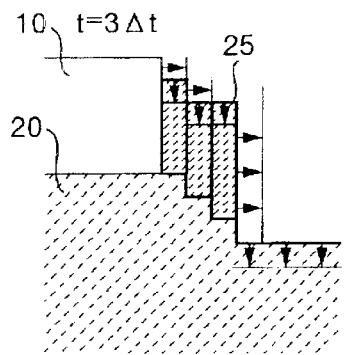
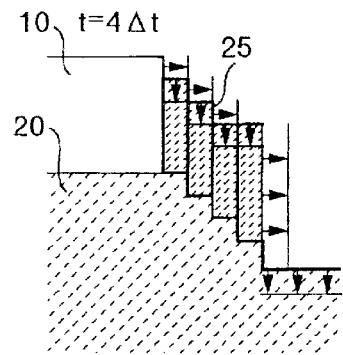
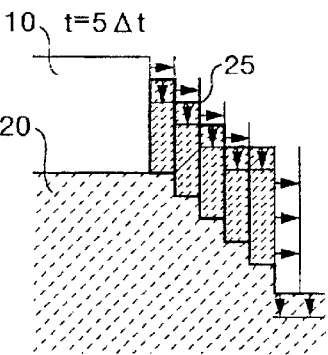
FIG.2G
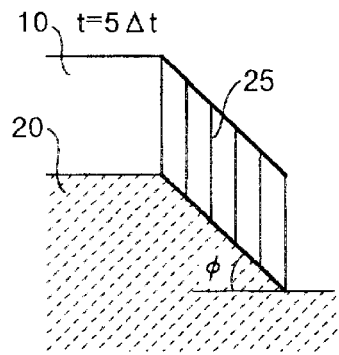

BEFORE ETCHING

AFTER ETCHING

AFTER REMOVAL OF
DEPOSITION MATERIAL

PARALLEL WITH SIDE
WALL OF MASK

DEPOSITION
MATERIAL IS EXPOSED

MASK OR UNDERLYING
MATERIAL IS EXPOSED

FIG.7A

REGION A

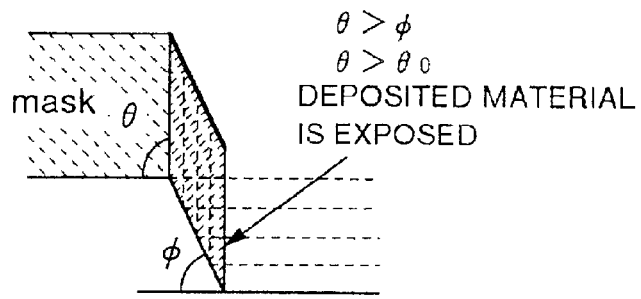

$\theta > \phi$
$\theta > \theta_0$
DEPOSITED MATERIAL IS EXPOSED

DEPOSITION MATERIAL ATTACHES TO MASK, TAPER ANGLE $\phi$ OF ETCHED MATERIAL IS DETERMINED BY TAPER ANGLE $\theta$ OF MASK

FIG.7B

REGION B

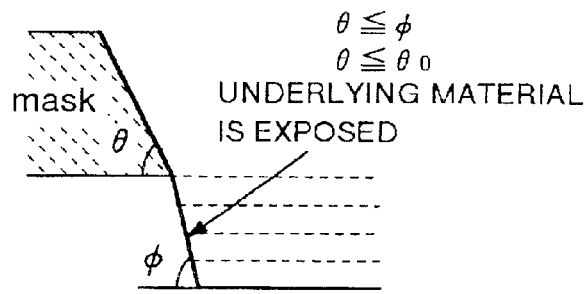

$\theta \leq \phi$
$\theta \leq \theta_0$
UNDERLYING MATERIAL IS EXPOSED

NO DEPOSITION MATERIAL ATTACHES TO MASK, TAPER ANGLE $\phi$ OF ETCHED MATERIAL IS INDEPENDENT OF TAPER ANGLE $\theta$ OF MASK

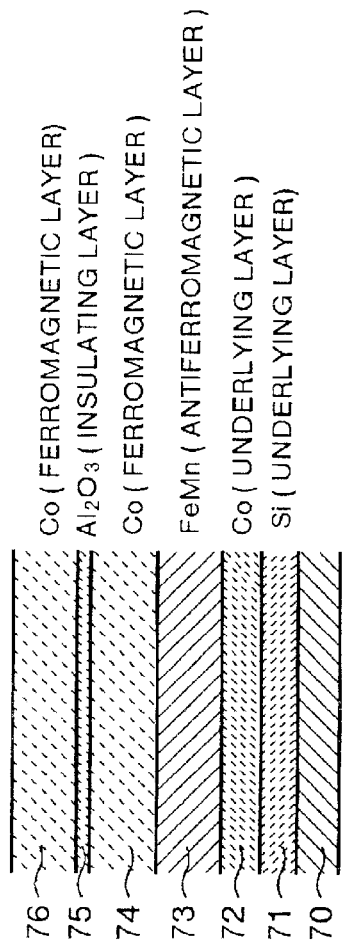
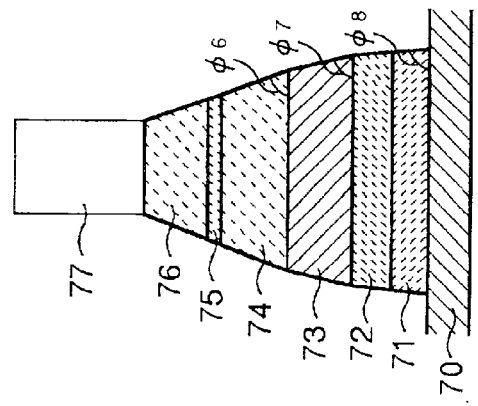
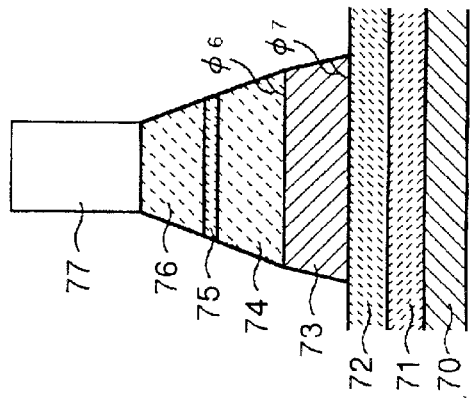
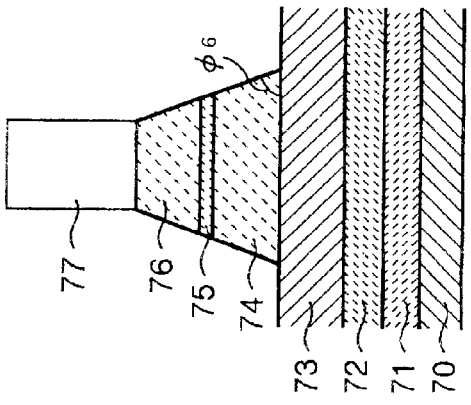
FIG. 17A
FIG. 17B
FIG. 17C
FIG. 17D

ETCHING METHOD OF HARDLY-ETCHED MATERIAL AND SEMICONDUCTOR FABRICATING METHOD AND APPARATUS USING THE METHOD

BACKGROUND OF THE INVENTION

The present invention relates to a method of etching hardly-etched materials such as Pt, Ru, Ir, PZT, HfO2 and the like, a semiconductor integrated circuit device including hardly-etched materials, and a method of manufacturing the same, and more particularly, to technologies which are effective in etching a side wall of a hardly-etched material substantially to the perpendicular.

Conventionally, methods of etching semiconductor devices using a tapered photoresist and a rounded-head photoresist are known as means for processing the surface of the semiconductor device.

A method of etching using a tapered mask is disclosed in U.S. Pat. No. 5,818,107 (JP-A-10-214826) and JP-A-10-223855. On the other hand, a method of etching using a rounded photoresist is disclosed in U.S. Pat. No. 6,057,081 (JP-A-10-98162).

However, a non-volatile material, which is difficult to etch (hereinafter simply called a (hardly-etched material), is etched at high temperatures higher than 300° C., so that a photoresist may not be available.

SUMMARY OF THE INVENTION

With the miniaturization of semiconductor devices and faster operations, investigations are under progress about the use of such materials as alumina, zirconium oxide, hafnium oxide, ruthenium, platinum, tantalum oxide, BST, SBT, PZT and the like for gate insulating films, gate electrodes of MOS (metal-oxide-semiconductor) transistors, and capacitors and capacitor electrodes of memories. In addition, nickel, cobalt, and manganese, or their alloys are used for magnetic-based memories (MRAM: magnetic random access memory) and the like.

Hardly-etched materials may be exemplified by the following materials:

Magnetic Materials: (Applications: Magnetic Disk, MRAM, etc.) Fe, Co, Mn, Ni, etc.

Precious Metals, etc: (Applications: Various Electrodes, etc.)

Pt, Ru, RuO2, Ta, Ir, IrO2, Os, Pd, Au, Ti, TiOx, SrRuO3, (La, Sr)CoO3, Cu, etc.

High Dielectric Materials: (Applications: Capacitors of DRAM (for accumulating charge), etc)

BST: (Ba, Sr)TiO3, SRO: SrTiO3, BTO: BaTiO3, SiTa2O6, Sr2Ta2O7, ZnO, Al2O3, ZrO2, HfO2, Ta2O5, etc.

Ferroelectric Materials: (Applications: Capacitors of FeRAM, etc.)

PZT: Pb(Zr, Ti)O3, PZTN: Pb(Zr,Ti)Nb2O8, PLZT: (Pb, La) (Zr, Ti)O3,

PTN: PbTiNbOx, SBT: SrBi2Ta2O9, SBTN: SrBi2(Ta, Nb)2O9.

BTO: Bi4Ti3O12, BiSiO$_x$, BLOT: Bi$_{4-x}$La$_x$Ti$_3$O$_{12}$, etc.

Compound Semiconductors: GaAs, etc.

ITO, etc.: InTiO, etc.

These hardly-etched materials are hard to etch, as compared with such materials as aluminum, silicon, silicon oxide and the like, and therefore present a problem in their difficulties in processing a side wall thereof perpendicularly to a substrate.

Any of the aforementioned known documents does not suggest processing a side wall of a hardly-etched material perpendicularly to a substrate.

Next, the following explanation will be given of reasons for difficulties in etching chemically stable materials to the perpendicular when using a plasma. The chemically stable materials include iron, cobalt, manganese, nickel, platinum, ruthenium, tantalum, alumina, hafnium oxide, zirconium oxide, gallium arsenide and the like.

In the aforementioned hardly-etched materials listed above, which are difficult to etch, a reaction product is produced by etching. The reaction product flies out of the surface of a sample into a vapor phase, and then reaches a wall of an etched material. The reaction product has the nature of readily attaching to the wall of the etched material as it reaches there. If the reaction product attaches only to a position at which the etched material is being etched, this would substantially cause only a reduction in the etching rate. Actually, however, the reaction product attaches to any positions on the etched material. Specifically, the reaction product also attaches to a side wall of the etched material which is not hardly being etched, so that, as a result, the bottom of the etched material is being etched simultaneously with the deposition of the reaction product or a deposition material on the side wall. Consequently, the etching fails to provide the side wall of the etched material perpendicular to the substrate. The foregoing is the cause of the failure in providing a hardly-etched material with its side wall perpendicular to the surface of the substrate in etching the hardly-etched material.

The foregoing reason for the failure in providing an etched material with a side wall perpendicular to a substrate will be explained in greater details with reference to FIGS. 1A through 2G.

FIGS. 1A, 2A illustrate an initial state of etching, where arrows oriented to the right indicate a direction in which a deposition material is deposited, and arrows oriented downward indicate an etching direction. Assume herein that the angle of a side wall of a mask 10 to the top surface of a substrate (taper angle) is at 90 degrees. As a short unit time Δt elapses from the initial state, the bottom (the top surface 21 of the etched material 20 exposed to a plasma) is etched by Δe, and the deposition material 25 is deposited on the side walls of the mask 10 and the etched material 20 by Δd (FIGS. 1B, 2B). Actually, a top surface 30 of the deposition material is also etched, so that the angle φ of the top surface 30 to the surface of the substrate (taper angle) is determined by the amount Δd of the deposition material 25 deposited per unit time (deposition rate), and the amount Δe of etching per unit time (etching rate).

In a portion 32 beneath the side wall of the mask 10, at an instance the deposition of the deposition material 25 begins on the side wall of the mask 10, the etching is stopped for a bottom portion 33 of the deposition material on the side wall of the mask 10 (the top surface 21 of the etched material 20 exposed to the plasma). However, at an instance an exposed portion of the etched material 20 is etched in a lower portion of the side wall of the deposition material 25 on the side wall of the mask 10, so that a new side wall of the etched material 20 is exposed, the deposition material is deposited on this exposed surface. Consequently, the etched material 20 is etched in a diagonally downward direction (FIGS. 1C, 2C).

Next, as another unit time Δt elapses from the states illustrated in FIGS. 1C, 2C, the deposition material 25 is further deposited on the side wall of the former deposition material 25, while an exposed portion of the etched material 20 is etched in a lower portion of the side wall of the deposition material 25 (FIGS. 1D, 1E, 2D–2F). In this manner, the etching sequentially advances diagonally downward, resulting in an etching shape as illustrated in FIGS. 1F, 2G. Eventually, the side wall of the etched material 20 forms a taper angle $\phi$ ($\phi$<90 degrees) to the surface of the substrate.

It is therefore an object of the present invention to provide a method of etching a hardly-etched material, which is capable of solving the problems inherent in the prior art, as well as a semiconductor fabricating method and apparatus using the etching method.

It is another object of the present invention to provide a method and apparatus for processing the surface of a sample, which is capable of consistently processing a plurality of wafers, or forming a taper angle of an etched material close to the perpendicular, for responding to the requirement for miniaturization of semiconductor devices and the like.

The present invention is characterized by a plasma-based surface processing method which uses a tapered mask to etch a sample or a film formed on a substrate.

Specifically, according to one aspect of the present invention, a plasma-based etching method is provided for etching a film of hardly-etched material formed on a substrate using the film and a mask formed on the hardly-etched film. The method includes the step of etching the film of hardly-etched material using the mask having a side wall angled at less than 90 degrees with respect to the surface of the substrate.

Thus, according to the present invention, for etching a material which is hard to form with a perpendicular side wall, the etched material can be formed with a side wall close to the perpendicular by the use of a tapered mask, thereby fabricating high performance semiconductor devices or highly integrated semiconductor devices.

Other objects, features and advantages of the invention will become apparent from the following description of the embodiments of the invention taken in conjunction with the accompanying drawings.

BRIEF DESCRIPTION OF THE DRAWINGS

FIGS. 2A–2G are cross-sectional views for explaining an etching process using a mask having a perpendicular side wall;

FIGS. 7A, 7B are diagrams showing the relationship between the taper angle of the mask and the taper angle of the etched material when the taper angle of the mask is in a region smaller than a limit value, and when in a region equal to or larger than the limit value;

FIGS. 17A–17D are diagrams for explaining a method of substantially providing the effect of a tapered mask in an MRAM by using a mask, the taper angle of which is substantially 90 degrees.

DETAILED DESCRIPTION OF THE EMBODIMENTS

In the following, one embodiment of the present invention will be described in detail with reference to the accompanying drawings.

Figure 1A:
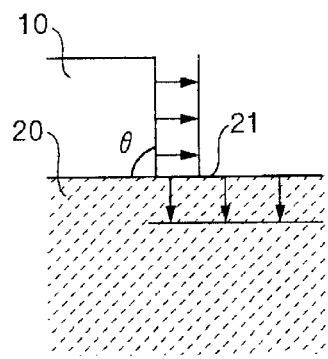
FIGS. 1A–1F are cross-sectional views for explaining an etching process using a mask having a perpendicular side wall.
Figure 1B:
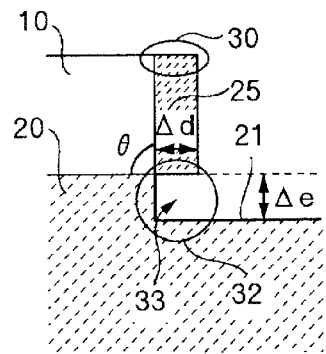
Figure 1C:
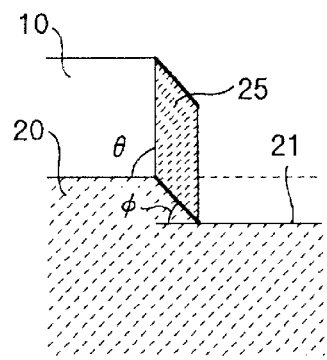
Figure 1D:
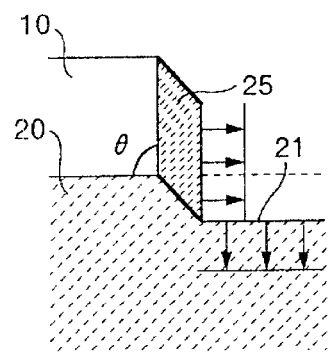
Figure 1E:
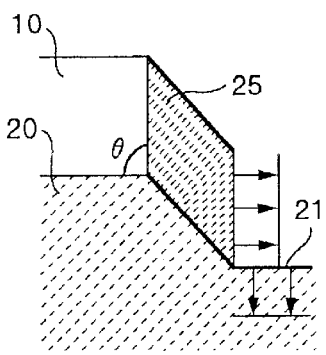
Figure 1F:
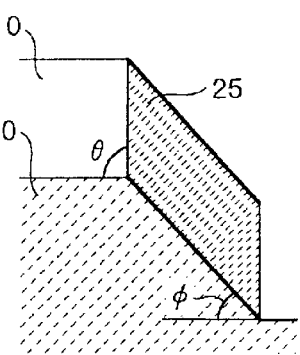
Figure 3:
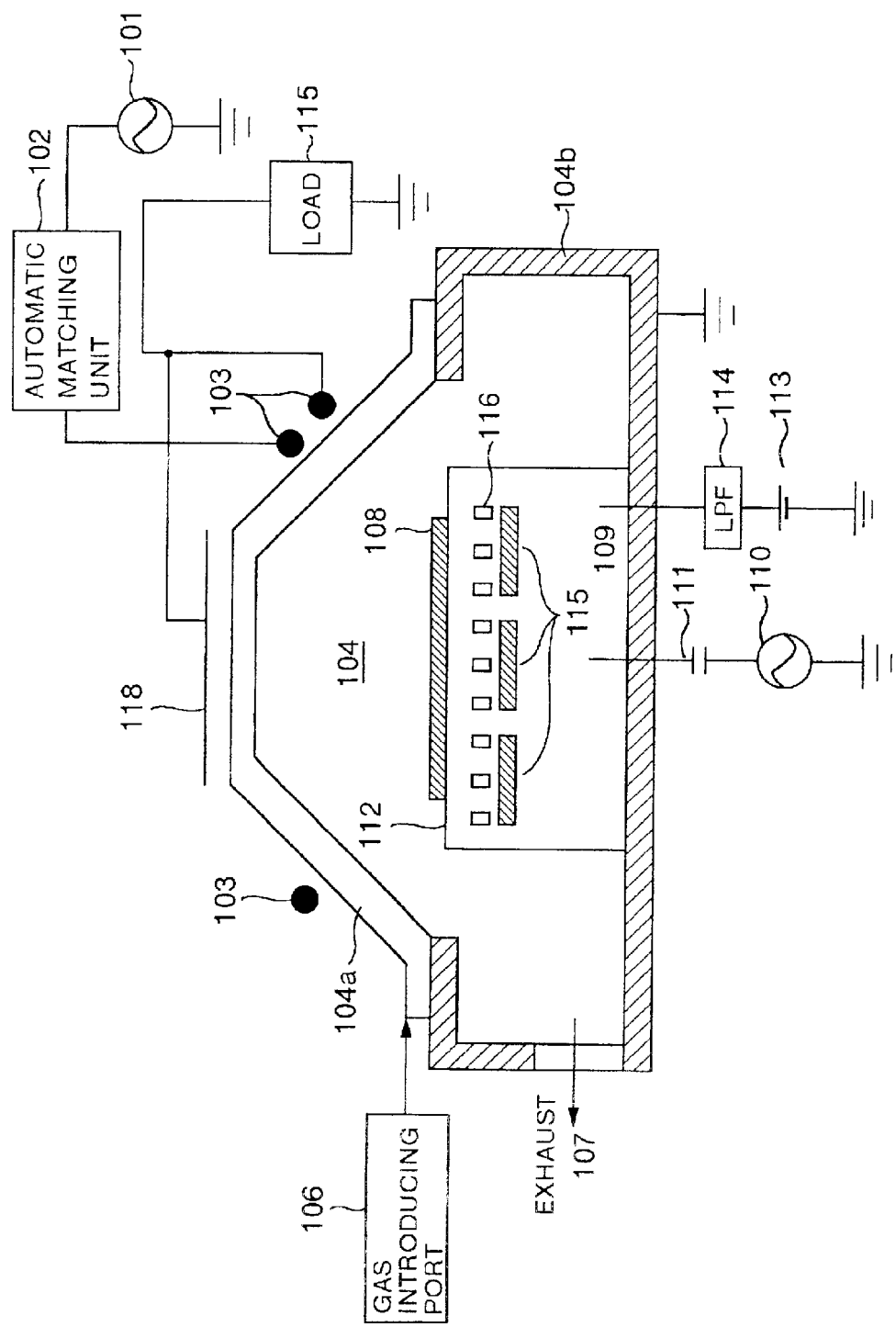
FIG. 3 is a diagram generally illustrating an exemplary configuration of a plasma etching apparatus to which the present invention is applied.

FIG. 3 is a diagram generally illustrating an exemplary configuration of a plasma etching apparatus to which the present invention is applied. A coil 103 is supplied with a high frequency current from a high frequency power supply 101 through an automatic matching unit 102 to generate a plasma 105 in a vacuum chamber 104. The vacuum chamber 104 is comprised of a discharge section 104a made of an insulating material, and a processing section 104b connected to a ground. An etching gas such as a chlorine is introduced into the vacuum chamber 104 through a gas introducing port 106, and exhausted from an exhauster 107.

A sample 108 is carried on a sample base 109. For increasing the energy of ions incident on the sample 108, a bias power supply 110, which is a second high frequency power supply, is connected to the sample base 109 through a high pass filter 111. An insulating film 112 made of ceramic or the like is coated on the surface of the sample base 109. A direct current power supply 113 is also connected to the sample base 109 through a low pass filter 114 for electrostatically holding the sample 108 on the sample base 109.

The sample base 109 is further provided with a heater 115 and a coolant flow passage 116 for adjusting the temperature of the sample 108 to control the processing.

Typical conditions for etching a chemically stable material using the plasma etching apparatus are detailed below. Chemically stable materials include iron, cobalt, manganese, nickel, platinum, ruthenium, tantalum, alumina, hafnium oxide, zirconium oxide, gallium arsenide and the like. The apparatus is maintained at a pressure of 0.5 Pa, and chlorine is mainly introduced into the apparatus. Though depending on an etched material under processing, the temperature of the sample 108 is in a range of 200° C. to 500° C. Though the temperature is determined by a required etching rate, or a particular semiconductor device to be fabricated, the sample 108 is maintained at high temperatures as compared with typical temperatures in a range of 0° C. to 100° C. when a silicon film, an aluminum film or a silicon oxide film is etched. Due to the high temperature, it is often the case that a photoresist cannot be effectively used for a material of a mask for use in etching, and instead, a hard mask made of silicon oxide, metal or the like is used in many cases.

To solve the aforementioned problem in etching a hardly-etched material, i.e., for etching an etched material to form a taper angle φ of the etched material close to the perpendicular to the surface of a substrate, it is critical to suppress the amount of deposition material attaching to the side wall of the mask.

It is contemplated to reduce the pressure within a reaction chamber, and increase the flow rate of a gas introduced into the reaction chamber as a method of suppressing the deposition of the deposition material. However, the pressure in the reaction chamber and the flow rate of the gas are often limited within proper ranges for achieving desired etching characteristics, and moreover, the limits of the pressure and flow rate are determined by an exhaust capability. It is therefore difficult to suppress the deposition of the deposition material by manipulating the pressure, flow rate and the like.

Figure 4A:
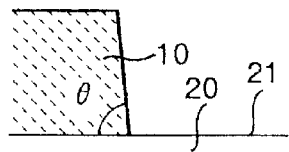
FIGS. 4A–4D are cross-sectional views for explaining an etching process when a taper angle θ of a mask is chosen to be less than 90 degrees.

Next, referring to FIGS. 4A–5D, the following explanation will be focused on the reason for the ability to process an etched material with a taper angle (the angle of the side wall of the etched material to the top surface of the substrate) φ close to the perpendicular by using a mask, the taper angle (the angle of the side wall of the mask 10 to the surface of the substrate) θ of which is less than 90 degrees. FIG. 5A shows the etching process when the taper angle θ of the mask is chosen to be 90 degrees, in which case a deposition material 25 is deposited in parallel with the side wall of the mask 10, as previously explained in connection with FIGS. 1A–2G. FIG. 4A in turn shows a state before etching when the taper angle θ of the mask is chosen to be 90 degrees.

Figure 4B:
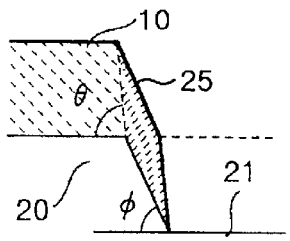

First, as the process conditions are determined, an etching rate is determined for the bottom of the sample (a surface 21 of the etched material exposed to a plasma). As the sample is etched using chlorine as a main etching gas, chlorides (reaction product) of the etched material of the sample fly out of the substrate (sample)into the etching apparatus (reaction chamber). The reaction product flying out into the etching apparatus again impinges on the substrate, and some of the reaction product impinging on the substrate is deposited on the surface of the substrate (the side wall of the mask, and the side wall of the etched material) as a deposition material (FIG. 4B). In many cases, the deposition material can be approximated to be isotropic. The deposition rate of the deposition material (hereinafter simply called the "deposition rate") is represented by rd. On the other hand, the etching mainly relies on the action of ions, so that the etching rate is largely affected by a direction in which the ions impinge at a position of the etched material at which it is to be etched. Assuming that the etching rate is simply determined by the flux of ions, the etching rate is represented by re×sin α, where re is the etching rate for the bottom of the sample when the ions impinge substantially perpendicular thereto, and α is the incident angle of the ions. It should be noted that re is the true etching rate when no deposition material is deposited.

Figure 4C:
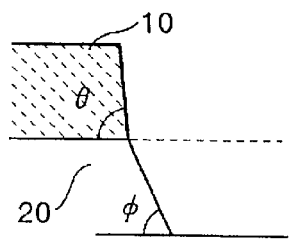
Figure 4D:
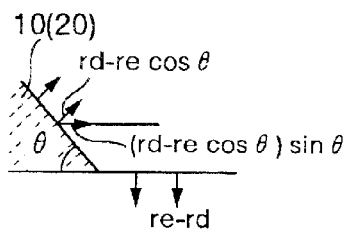

In other words, when the side wall of the mask is perpendicular to the surface of the substrate, the deposition rate of the deposition material to the side wall of the mask is represented by rd, and an apparent etching rate on the bottom 21 of the sample is represented by re−rd (see FIG. 4D). In this event, the taper angle φ of the etched material is given by:

$$\tan \phi = (re-rd)/rd$$

Figure 5A:
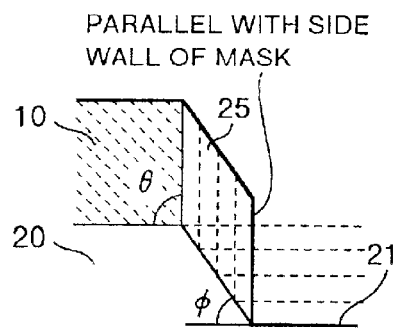
FIGS. 5A–5D are cross-sectional views for explaining the relationship between the deposition of a deposition material on a side wall of a mask and a taper angle $\phi$ of an etched material when the taper angle θ of the mask is gradually reduced from 90 degrees.
Figure 5B:
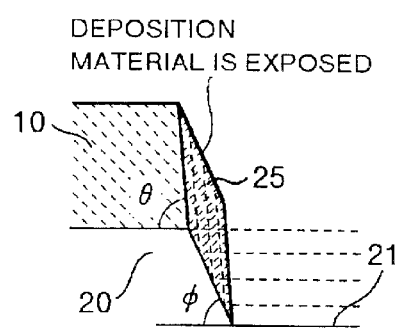

On the other hand, as illustrated in FIGS. 4B, 5B, when the side wall of the mask is inclined slightly from the perpendicular to the surface of the substrate (the taper angle θ of the mask is less than 90 degrees), the deposition rate to the side wall of the mask is represented by rd since it is isotropic, while the etching rate on the side wall of the mask is represented by re×cos θ. Thus, rd−re×cos θ represents the deposition rate to the side wall when the taper angle of the mask is θ. Consequently, as illustrated in FIG. 4D, the taper angle φ of the etched material is given by:

$$\tan \phi = (re-rd)/((rd-re \times \cos \theta) \times \sin \theta)$$

In this manner, under a condition in which the deposition material is being deposited on the side wall of the mask, as the taper angle θ of the mask is smaller, the taper angle φ of the etched material is larger after etching. FIG. 4C illustrates the mask 10 and etched material 20 from which the deposition material has been removed after the etching process as illustrated in FIG. 4B.

Figure 5C:
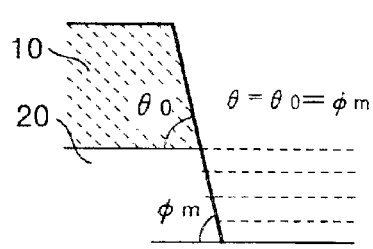
Figure 5D:
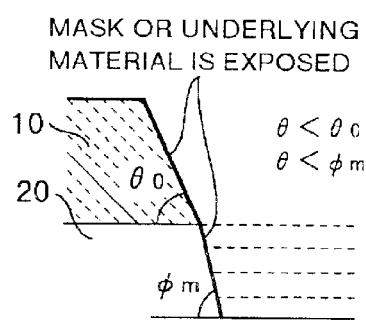

As the taper angle θ of the mask is gradually reduced from 90 degrees further from that shown in FIG. 5B, the taper angle θ matches the taper angle φ of the etched material (θ=φ)), as illustrated in FIG. 5C. This state represents a condition that no more deposition material is deposited on the mask. Specifically, even if the deposition material is deposited on the mask, the deposition material is instantaneously etched away, so that no deposition material attaches to the mask, as a result. Assuming that the taper angle of the mask is θ0, and the taper angle of the etched material is φm in this condition, the taper angle of the etched material will not exceed φm even if the taper angle θ of the mask is further reduced (i.e., θ<θ0), as illustrated in FIG. 5D. Specifically, as illustrated in FIG. 5D, when θ<θ0, θ<φm stands, causing the taper angle θ0 of the mask to reach a limit value at which the taper angle φ of the etched material is at maximum (φm). In the state illustrated in FIG. 5D, the mask or underlying material (etched material) is exposed.

Figure 6:
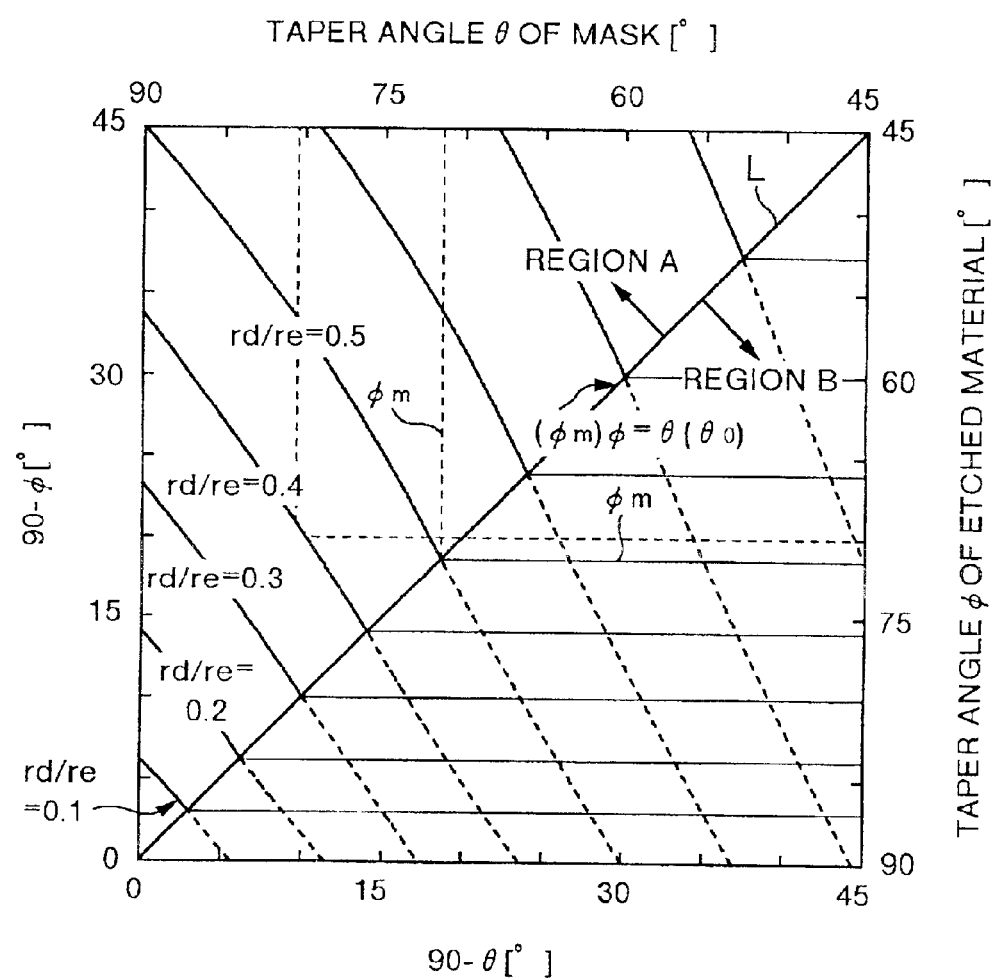
FIG. 6 is a graph showing the relationship between the taper angle of the mask and the taper angle of the etched material.

The relationship between the taper angle θ of the mask and the taper angle φ of the etched material is as shown in FIG. 6. Here, rd/re is uniquely determined by the mask, the nature of the etched material and etching conditions (the pressure in the reaction chamber, the flow rate of a gas introduced into the reaction chamber, and the like). Generally, rd/re is smaller as the pressure in the reaction chamber is higher, and rd/re is smaller as a larger flow rate of a gas is introduced into the reaction chamber.

As shown in FIG. 6, for example, when rd/re=0.5, as the taper angle θ of the mask is reduced from 90 degrees, the taper angle φ of the etched material is increased substantially in proportion to the taper angle θ of the mask. As the taper angle θ of the mask is reduced to 72 degrees, the taper angle φ of the etched material is correspondingly increased to 72 degrees (θ=θ), reaching the state illustrated in FIG. 5C. In other words, θ=θ0=φ=φm stands. Therefore, even if the angle θ of the mask is further reduced (θ<θ0), the taper angle of the etched material remains at φm.

Thus, in FIG. 6, a line L indicates the limit value θ0 of the taper angle of the mask. It can be seen from the foregoing that the deposition material attaches to the mask in a region A where θ>θ0, and the taper angle φ of the etched material is determined by the taper angle θ of the mask. On the hand, in a region B where θ·θ0, the deposition material does not attach to the mask, and the taper angle φ of the etched material remains at the constant value φm irrespective of the taper angle θ of the mask. Therefore, for example, when rd/re=0.4, if the taper angle φ of the etched material is to be set at 70 degrees, the taper angle θ of the mask may be set at approximately 82 degrees.

Next, explanation will be given of a method of forming a mask with a side wall having a taper angle less than 90 degrees. In the following explanation, a Pt film is etched using a hard mask made of silicon oxide, as an example.

Figure 8A:
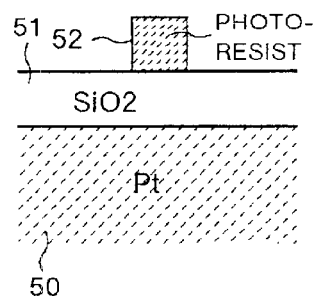
FIGS. 8A–8E are diagrams for explaining a method of controlling the taper angle of the mask by manipulating components of an etching gas and an etching pressure.
Figure 8B:
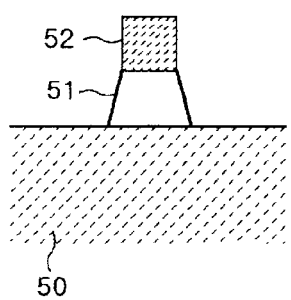

(a) Referring to FIGS. 8A–8E, explained first is a method of controlling the taper angle of the side wall of the silicon oxide which serves as a mask by manipulating components of an etching gas and an etching pressure. A hard mask material 51 made of a silicon oxide film or a metal film is formed on a Pt film 50, and an overlying photoresist 52 is patterned into a predetermined pattern (FIG. 8A). Next, using an additive gas mainly consisting of a fluorocarbon based gas, oxygen and the like, the silicon oxide film is etched in a tapered shape (FIG. 8B). In this event, the silicon oxide film can be etched into a tapered shape by switching the composition of the gas introduced into the etching chamber, and changing the etching pressure.

Such etching into a tapered shape is described, for example, in J. Vac. Sci. Technol. A14, 1832 (1996). This document describes a method of controlling a taper angle of a silicon oxide film by manipulating components of an etching gas, and an etching pressure. Specifically, under etching conditions including the use of a photoresist having a taper angle of 86°, a flow rate of CF4 at 20 sccm, and bias power at 100 W, the formed taper angle of the silicon oxide film changes from 80° to 51° by changing the pressure from 40 mTorr to 300 mTorr. Also, under etching conditions including the pressure at 40 mTorr and a total flow rate of CHF3 and CHF4 at 20 sccm, the taper angle of the silicon oxide film changes from 66° to 84° by changing the component ratio of the etching gas (CHF3 in CF4 (%)) from 0% to 50%.

In this manner, it is understood that the taper angle of the oxide film can be controlled by making use of the fact that the etching rate for the silicon oxide film in the horizontal direction is substantially independent of the pressure, whereas the etching rate in the vertical direction is reduced as the pressure is increased.

Figure 8C:
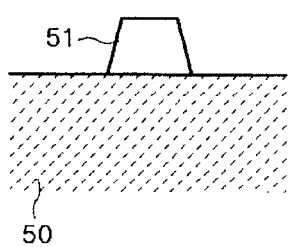
Figure 8E:
Figure 8D:
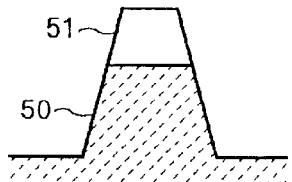

When the taper angle of the silicon oxide film can be formed less than 90 degrees (FIG. 8B), the photoresist 52 is removed (FIG. 8C). Next, the substrate is carried to a predetermined position in the etching apparatus for etching (FIG. 8D), and then, the mask 51 is removed (FIG. 8E).

Another etching method for forming the taper angle of the mask less than 90 degree is described in U.S. Pat. No. 5,856,239.

Figure 9A:
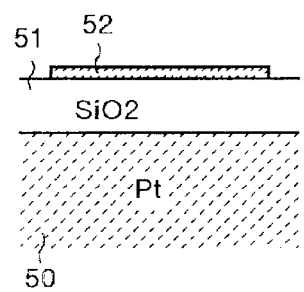
FIGS. 9A–9E are diagrams for explaining a method of controlling the taper angle of the mask by wet etching.
Figure 9B:
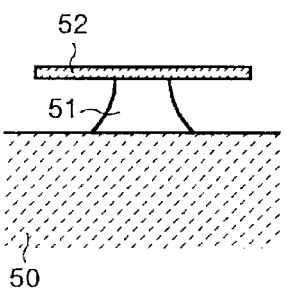
Figure 9C:
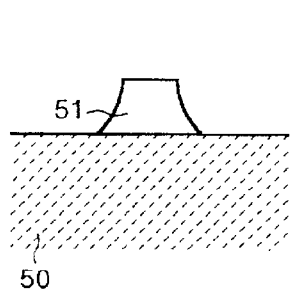
Figure 9E:
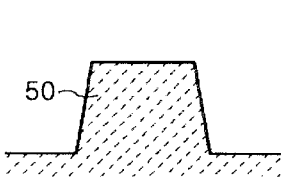
Figure 9D:
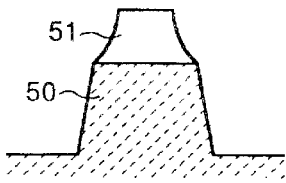

(b) Next explained will be a method of forming a silicon oxide film, serving as a mask, with a taper angle of less than 90 degrees by wet etching. Such a method is disclosed, for example, in Jpn. J. Appl. Phys., Vol. 34 (1995), pp. 2132–2136. Specifically, as illustrated in FIG. 9A, a polysilicon film 52 in a predetermined pattern is formed on a silicon oxide film 51 which serves as a mask for etching a Pt film 50, and immersed in an HF solution under a constant condition. While the polysilicon film 52 is not etched by the HF solution, the silicon oxide film 51 is isotropically etched by the HF solution, and accordingly formed into a tapered shape as illustrated in FIG. 9B. Subsequently, the polysilicon film 52 is etched using chlorine C12, fluorine F2, hydrogen hexafluoride SF6 or the like, to eventually form a silicon oxide mask 51 having the shape as illustrated in FIG. 9C. Thus, the Pt 50 film is etched using the tapered mask as illustrated (FIG. 9D), and then, the mask 51 is removed (FIG. 9E).

FIGS. 10A–13D show several methods of forming masks made of silicon oxide film having different taper angles with the same width (size).

Figure 10A:
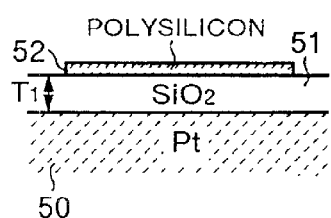
FIGS. 10A–10I are diagrams for explaining a method of controlling the taper angle of the mask by wet etching.
Figure 10B:
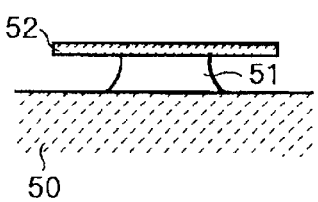
Figure 10C:
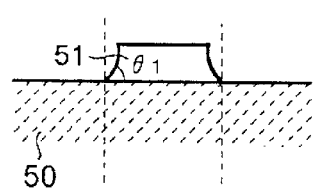
Figure 10D:
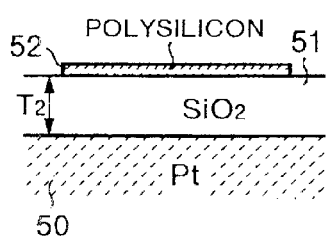
Figure 10E:
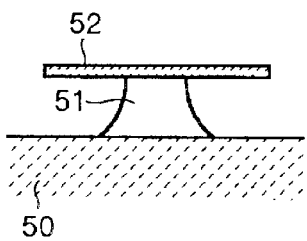
Figure 10F:
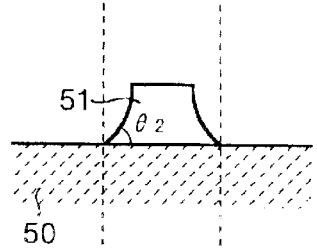
Figure 10G:
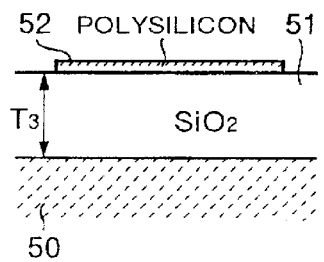
Figure 10H:
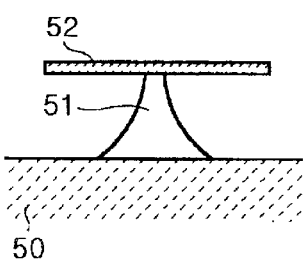
Figure 10I:
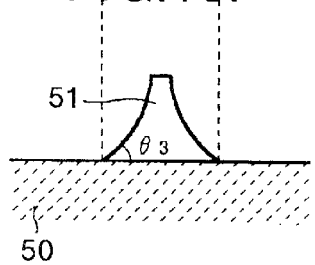

First, a method shown in FIGS. 10A–10I forms masks having the same width (size) and different taper angles by manipulating the film thickness of a silicon oxide film 51 serving as a mask, and a wet etching time chosen for a particular film thickness. For example, silicon oxide films 51 having different thicknesses T1, T2, T3 have been formed as illustrated in FIGS. 10A, 10D, 10G, respectively, and then HF-based wet etching is conducted for a time in accordance with each thickness of the silicon oxide film, resulting in the formation of masks having different taper angles, as illustrated in FIGS. 10B, 10E, 10H, respectively. Therefore, as the polysilicon film 52 is removed afterwards, the resulting masks are formed with the same width (size) and different taper angles θ1, θ2, θ3, respectively, as illustrated in FIGS. 10C, 10F, 10I (where θ1 >θ2 >θ3). As can be seen, a smaller taper angle can be set for the mask as the silicon oxide film 51, as the mask, has a larger film thickness.

Figure 11A:
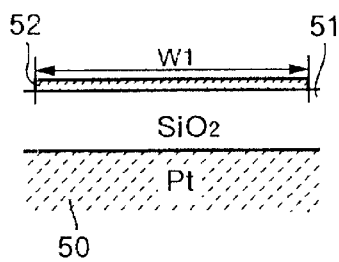
FIGS. 11A–11I are diagrams for explaining another method of controlling the taper angle of the mask by wet etching.
Figure 11B:
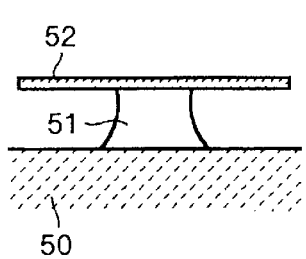
Figure 11C:
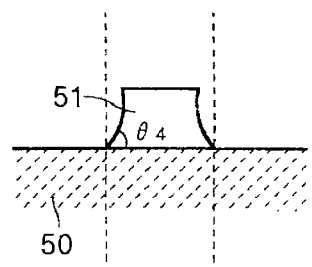
Figure 11D:
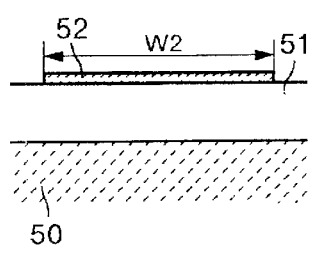
Figure 11E:
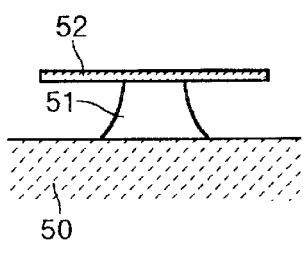
Figure 11F:
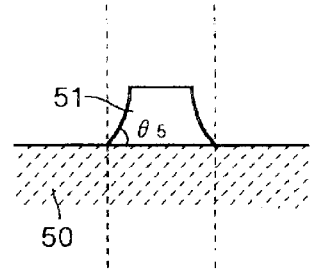
Figure 11G:
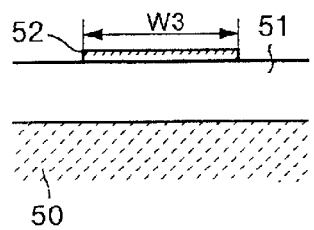
Figure 11H:
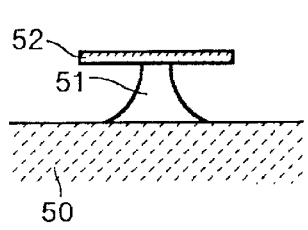
Figure 11I:
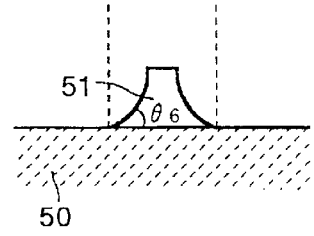

A method shown in FIGS. 11A–11I forms masks having the same width (size) and different taper angles by manipulating the width (size) of a polysilicon film, which serves as a mask, and a wet etching time chosen for a particular width. For example, the polysilicon films 52, which serve as a form and a resist, are formed with different widths (sizes) W1, W2, W3, as illustrated in FIGS. 11A, 11D, 11G, respectively, and then, HF-based wet etching is conducted for a time in accordance with a particular width (size) of the polysilicon film 52, resulting in the formation of masks having different taper angles, respectively, as illustrated in FIGS. 11B, 11E, 11H. Therefore, as the polysilicon film 52 is removed afterwards, the resulting masks are formed with the same width (size) and different taper angles θ4, θ5, θ6, respectively, as illustrated in FIGS. 11C, 11F, 11I (where θ4>θ5>θ6). As can be seen, a smaller taper angle can be set for the mask as the polysilicon film 52 has a smaller width (size).

FIGS. 12A–13D show methods of controlling the taper angle by dry etching and wet etching.

Figure 12A:
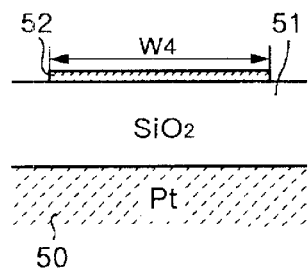
FIGS. 12A–12D are diagrams for explaining a method of controlling the taper angle of the mask by dry etching and wet etching.
Figure 12B:
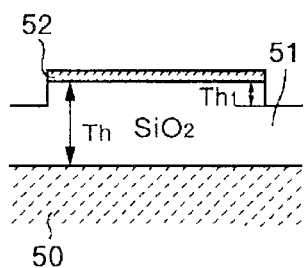
Figure 12C:
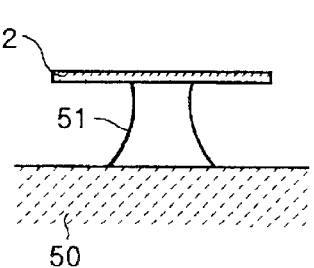
Figure 12D:
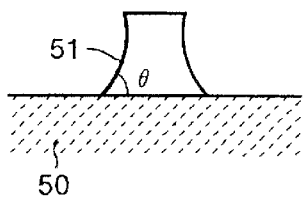

In a method shown in FIGS. 12A–12C, a polysilicon film 52 is first patterned into a predetermined width (size) W4 (FIG. 12A), followed by dry etching which substantially perpendicularly removes a portion of a silicon oxide film 51 by a thickness Th1 (FIG. 12B), followed by wet etching which forms the silicon oxide film 51 into a tapered shape (FIG. 12C).

Figure 13A:
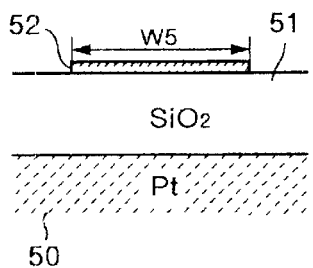
FIGS. 13A–13D are diagrams for explaining another method of controlling the taper angle of the mask by dry etching and wet etching.
Figure 13B:
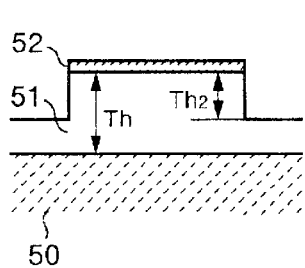
Figure 13C:
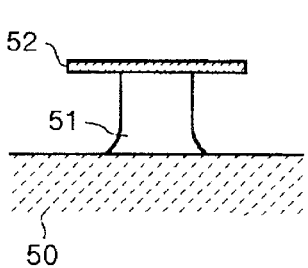
Figure 13D:
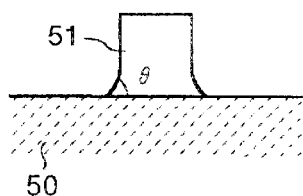

In a method shown in FIGS. 13A–13D, a polysilicon film 52 is first patterned into a predetermined width (size) W5 different from the aforementioned width (size) W4 (FIG. 13A), followed by dry etching which substantially perpendicularly removes a portion of a silicon oxide film 51 by a thickness Th2 different from the foregoing thickness Th1 (FIG. 13B), followed by wet etching which forms the silicon oxide film 51 into a tapered shape (FIG. 13C).

In this manner, when the polysilicon films 52 used in FIGS. 12A, 13A have the same thickness Th, the taper angle of the mask can be set smaller as the polysilicon film 52 has a smaller width (size), and the taper angle of the mask can be set smaller as the silicon oxide film 51 is etched by a smaller thickness.

In addition, the taper angle of the mask can be controlled by combining the foregoing tapered mask forming methods.

Now, the explanation will be made with reference to FIG. 3 as to the case for etching a Pt film having a thickness of 0.5 μm using an $SiO_2$ mask and the etching apparatus of FIG. 3.

As described above, a gas for use in the etching mainly consists of chlorine, and the Pt film is etched with a bias voltage applied to a wafer. In this event, since the $SiO_2$ mask is etched substantially at the same rate as the Pt film, the $SiO_2$ mask must have a thickness similar to that of the Pt film or more. Assume here that the $SiO_2$ mask has a thickness of 0.5 μm.

In the apparatus of FIG. 1, the ratio rd/re is equal to or higher than a constant value under a condition in which a plasma can be stably maintained. Assume here that a minimum value of rd/re is 0.4. In this event, it can be seen from FIG. 6 that when the $SiO_2$ mask has a taper angle of 90°, the Pt film has a taper angle of 57° after the Pt film is etched. That is, the width y of the bottom surface of the resulting Pt film is larger than the $SiO_2$ mask by about 0.3 μm at each of the side portions of the film (that is, x1=x2 =0.3 μm). This is derived from the expression of x1=x2=0.5 μm÷tan φ=0.5 μm÷tan 57°. Thus, assuming that the total width of the mask is 0.5 μm, the total width y of the bottom surface of the Pt film is about 1.1 μm (that is, y=0.5 μm+x1+x2=1.1 μm) when the Pt film is etched by 0.5 μm.

However, if the $SiO_2$ mask has been previously formed with a taper angle of 80° and is used for etching the Pt film under the same condition, the Pt film has a taper angle of 70° after being etched, and the width y of the bottom surface of the resulting Pt film is larger than the $SiO_2$ mask by about 0.2 μm at each of the side portions of the Pt film and has the total width y of about 0.9 μm (that is, y=0.5 μm+x1+x2=0.9 μm).

In this manner, by reducing the taper angle of the mask, the taper angle at which the Pt film is etched is increased. In other words, the shape resulting from the etching can be controlled by manipulating the taper angle of the mask.

When the taper angle of the mask is further reduced (for example, to 60°), the taper angle at which the Pt film is etched is further increased, however, giving rise to a problem that the mask is etched because no deposition material is deposited on the mask in this condition.

It is appreciated from the foregoing that a condition under which the taper angle is larger and the bottom surface of the mask maintains the size before etching is that the taper angle of the mask is chosen to be θ0. This taper angle θ0 of the mask can be predicted from the result of etching using a vertical mask. Specifically, assume that an angle φ (for example, 60°) is measured as a result of etching using a vertical mask. In this event, it is estimated from FIG. 6 that the value of rd/re is 0.37 under that condition. In an equation:

$$\tan \phi = (re - rd) / ((rd - re \times \cos \theta) \times \sin \theta)$$

a value estimated for rd/re (0.37 in this case) may be substituted to find θ which satisfies φ=θ (77°).

Figure 14A:
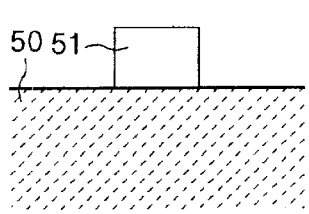
FIGS. 14A–14F are diagrams for explaining a method of substantially providing the effect of a tapered mask by using a mask, the taper angle of which is substantially 90 degrees.
Figure 14B:
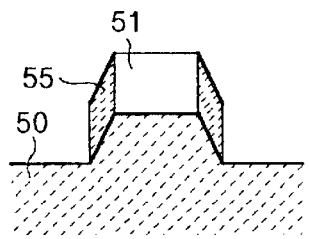
Figure 14C:
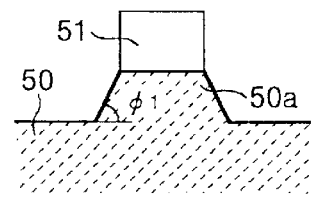
Figure 14F:
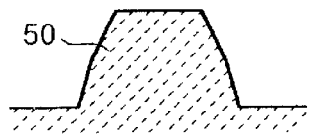
Figure 14E:
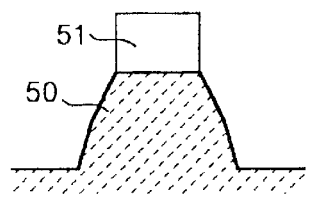
Figure 14D:
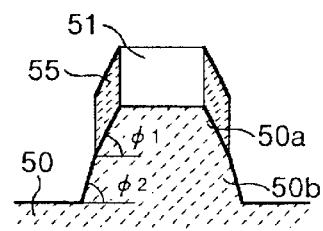

(c) Next, referring to FIGS. 14A–14F, explanation will be given of a method of substantially providing the effect of a tapered mask even using a mask made of silicon oxide having a substantially perpendicular side wall (i.e., the taper angle of which is substantially 90 degrees). First, using a mask made of silicon oxide 51 having a substantially perpendicular side wall, a Pt film 50, i.e., an etched material, is etched by a predetermined amount, for example, one-half of a desired etching amount (FIG. 14B). As described above, in this state, a deposition material 55 attaches to the side wall of the mask of silicon oxide 51 (FIG. 14B). Next, the deposition material 55 is removed (FIG. 14C). The deposition material 55 is typically removed by a wet process which uses pure water, ammonia water, sulfuric acid, hydrochloric acid, alcohol, or a mixture of some of them. After removing the deposition material 55, the Pt film 50, which is the etched material, has a protrusion 50a, the taper angle of which is φ1. After removing the deposition material 55, the Pt film 50 is again etched by the remaining amount to complete the etching of the desired amount (FIG. 14D). In this event, a deposition material 56 is deposited on side walls of the mask of silicon oxide 51 and the protrusion 50a of the Pt film 50. The deposition material 56 is deposited in a similar manner to the first deposition material 55. The Pt film 50 is exposed on the side wall of a protrusion 50b of the Pt 50 film resulting from the second etching. The protrusion 50b of the Pt film 50 thus formed has a taper angle φ2 (where φ1<φ2). In this manner, the first etching and the immediately following removal of the deposition material result in the substantial tapered mask having the taper angle φ1, comprised of the silicon oxide 51 and the protrusion 50a of the Pt film 50, as illustrated in FIG. 14C. The taper angle of the etched material can be made close to the perpendicular by using such a substantial tapered mask.

In addition, by repeating the etching and the removal of the deposition material a plurality of times, the taper angle of the etched material can be brought closer to the perpendicular. When the Pt film, which is the etched material, is exposed instead of the deposition material on the side wall in the shape provided immediately after the etching, the Pt film is advantageously etched immediately during overetching. If the deposition material is exposed, the deposition material should be first etched, followed by etching the Pt film, the etched material, during overetching. Thus, also advantageously, a time required for the overetching can be reduced.

Next, a method of removing a deposition material will be explained.

A deposition material may be removed by a process using super critical water or CO2, or by a dry process using a proper gas, in addition to the wet process. The dry process may be conducted using the same processing apparatus (the same reaction chamber) as the etching process for a Pt film. Further, etching at a certain instance and etching at another instance may be performed using the same etching apparatus (the same reaction chamber) or different etching apparatuses (different reaction chambers).

The dry process may be a plasma process which involves introducing, for example, oxygen, hydrogen, ammonia, chlorine, hydrogen chloride, or alcohol to generate a plasma, and removing the deposition material with the plasma.

Another wet-based method may involve exposing the deposition material to a mixture of super critical carbon dioxide with ammonia, alcohol, hydrochloric acid, or hydrogen peroxide to remove chlorides attached on a side wall.

In addition, a rinse step and a dry step may be interposed before or after the deposition material removing step as required. For example, when a deposition material is removed by a wet process using a chemical, the deposition material removing step may be followed by a washing step using pure water, and a subsequent dry step. The etching performed in the foregoing manner provides a point in the middle of a side wall of a mask or an etched material at which a taper angle (suddenly) changes. In other words, it is possible to provide a portion in the middle of the side wall of the mask or etched material at which the taper angle apparently changes. It should be noted that most of metal chlorides are water soluble.

Next, the present invention will be explained when it is applied to a semiconductor device fabricating apparatus with reference to FIGS. 15A, 15B.

Figure 15A:
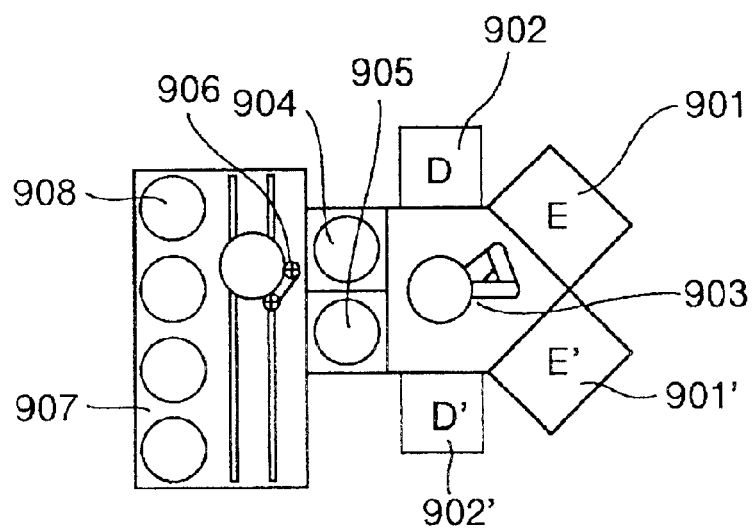
FIG. 15A is a block diagram illustrating an exemplary configuration of a semiconductor device fabricating apparatus to which the present invention is applied.

A semiconductor device fabricating apparatus illustrated in FIG. 15A is a multi-chamber type semiconductor device fabricating apparatus which comprises an etching processing chamber 901; a wafer carrying robot 903; a load lock chamber 904; an unload lock chamber 905; a loader 906; and a stocker 907. A cassette 908 is placed in the stocker 907. For processing a wafer in the processing chamber 901, a wafer 105 accommodated in the cassette 908 substantially in an atmospheric condition is carried into the load lock chamber 904 substantially in an atmospheric condition by the loader 906, and the load lock chamber 904 is closed. After reducing the pressure in the load lock chamber 904 to a proper level, the wafer 105 is carried into the processing chamber 901 by the wafer carrying robot 903, and is etched to the middle. Subsequently, the wafer 105 is carried into a deposition material removal processing chamber 902 by the wafer carrying robot 903 to remove a deposition material attached on side wall. Next, the wafer 105 is again carried into an etching processing chamber 901' by the wafer carrying robot 903 and etched by a desired amount. Then, the wafer 105 is carried into a deposition material removing processing chamber 902' by the wafer carrying robot 903 to remove a deposition material attached on the side wall. Next, the wafer 105 is carried into the unload lock chamber 905 by the wafer carrying robot 903. After increasing the pressure in the unload lock chamber 905 substantially to the atmospheric pressure, the processed wafer is inserted into the cassette 908 by the loader 906.

In this manner, FIG. 15A illustrates a semiconductor device fabricating apparatus which comprises a wafer carrier (903); a plurality of processing chambers (901, 901') and a plurality of post-processing chambers (902, 902') connected to the wafer carrier; a plurality of lock chambers (904, 905), and an atmosphere carrier (906) located adjacent to the lock chambers, where the atmosphere carrier can be connected to the plurality of lock chambers and a wafer cassette (908) adjacent to the atmosphere carrier. After a material under processing is etched in any of the plurality of processing chambers, the material under processing is post-processed in any of the plurality of post-processing chambers. Subsequently, the material under processing is again etched in any of the plurality of processing chambers, and further post-processed in any of the plurality of post-processing chambers.

Figure 15B:
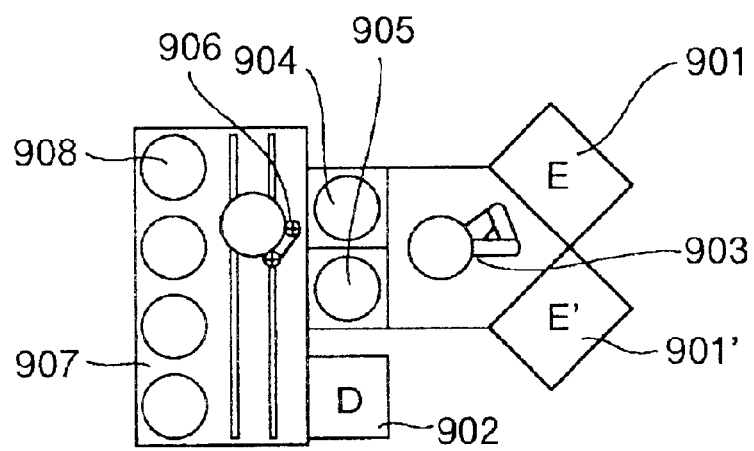
FIG. 15B is a block diagram illustrating another exemplary configuration of the semiconductor device fabricating apparatus to which the present invention is applied.

While the exemplary apparatus of FIG. 15A employs the atmosphere cassette, a vacuum cassette may be used instead as shown in FIG. 15B. Specifically, FIG. 15B illustrates a semiconductor device fabricating apparatus which comprises a wafer carrier (903); a plurality of processing chambers (901, 901') connected to the wafer carrier; a plurality of lock chambers (904, 905); and an atmosphere carrier (906) located adjacent to the lock chambers, wherein the atmosphere carrier can be connected to the plurality of lock chambers, a post-processing chamber (902) adjacent to the atmosphere carrier, and a wafer cassette (908). A material under processing is etched in any of the plurality of processing chamber, and then post-processed in the post-processing chamber. Subsequently, the material under processing is again etched in any of the plurality of processing chambers, and post-processed in the post-processing chamber.

Further, while the deposition removing process is performed in a vacuum condition for convenience of explanation, this process may be performed in an atmospheric condition.

In the foregoing exemplary apparatuses, the two etching processes are performed in the different etching processing chambers 901, 901'. Alternatively, the same process chamber 901 may be used a plurality of times. An advantage provided by using another processing chamber as an etching process chamber lies in the ability to stably etch stacked films in different conditions for the respective types of films. The etching as well as the removal of deposition material may be performed in the same chamber.

Figure 16A:
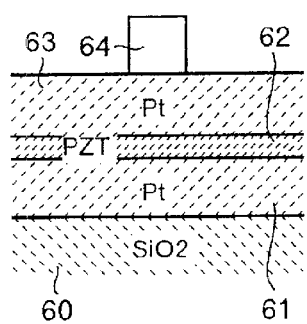
FIGS. 16A–16D are diagrams for explaining a method of substantially providing the effect of a tapered mask in a ferroelectric memory by using a mask, the taper angle of which is substantially 90 degrees.

Next, referring to FIGS. 16A–16D, explanation will be given of a method of etching stacked films such as Pt/PZT/Pt, which constitutes a memory area of a ferroelectric memory, using the method (c) illustrated in the aforementioned FIGS. 14A–14F, using a substantially tapered mask. In this method, if the Pt/PZT/Pt films 61–63 are processed by a single etching process as illustrated in FIG. 16A, a deposition material will be inevitably deposited on side walls of these films 61–63, resulting in the shape illustrated in FIG. 16D. Specifically, the dimensions of a mask 64 largely differ from the dimensions of a resulting etched material. This difference in dimensions will hinder the miniaturization.

Figure 16B:
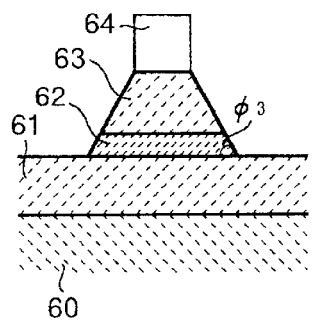
Figure 16C:
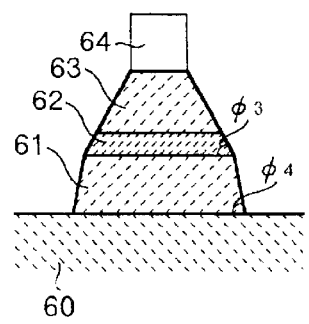
Figure 16D:
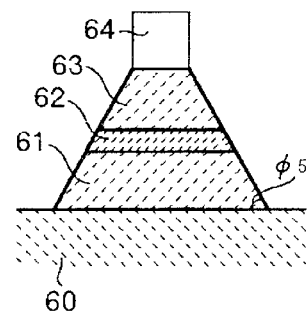
Figure 18:
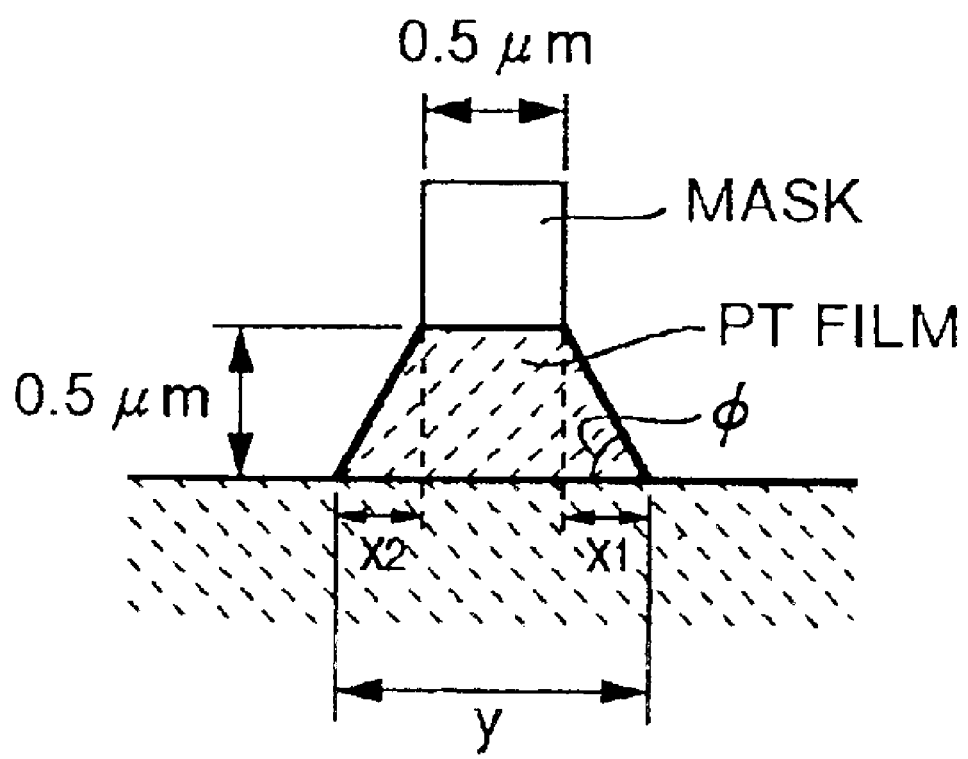
FIG. 18 is a cross-sectional view for explaining an etching process using a mask having a perpendicular side wall.

To avoid this inconvenience, immediately before etching the conductive (for example, Pt) film 61 underlying the insulating film (PZT) 62, the etching is interrupted to remove a deposition material (FIG. 16B). This results in the PZT/Pt films 62–63 having a taper angle $\phi 3$. Subsequently, as the etching is resumed, the shape as illustrated in FIG. 16C is provided. In the illustrated shape, the Pt film 61 has a taper angle $\phi 4$ (where $\phi 3 < \phi 4$). Characteristically, the films of the same conductor (for example, the Pt films 61, 63), formed on and below the insulating film (PZT) 62, have different taper angles $\phi 3$, $\phi 4$. Of course, the taper angle $\phi 4$ can be set larger than a taper angle $\phi 5$ shown in FIG. 16D.

In this manner, the first etching and the immediately following removal of the deposition material result in a substantial tapered mask having the taper angle $\phi 3$, comprised of the insulating film (PZT) 62 and conductive (for example, Pt) film 63, as illustrated in FIG. 16C. By using such a substantial tapered mask, an etched material included in stacked films can be formed with a taper angle close to the perpendicular.

Next, referring to FIGS. 17A–17D, explanation will be given of a method of etching stacked films in MPAM (magnetic random access memory), which is expected as a memory device of the next generation, using the method (c) illustrated in the aforementioned FIGS. 14A–14F, or the method illustrated in the aforementioned FIGS. 16A–16C, using a substantial tapered mask.

An MRAM has stacked films as illustrated in FIG. 17A, which comprise, from above, a ferromagnetic material (for example, Co) 76; an insulating film (for example, Al2O3) 75; a ferromagnetic material (for example, Co) 74; an antiferromagnetic material (for example FeMn) 73; and underlying materials (for example, Co and Si) 72, 71. The MRAM also includes a film 70, for example, a silicon oxide film 70. In the MRAM, it is required to etch these films 71–76 using a single mask.

In this event, if a larger amount of reaction product attaches on the FeMn film 73, for example, than on the other films, the etching is interrupted immediately before the etching of the FeMn film 73 is started to remove the deposition material (FIG. 17B). This results in the films 74–76 having a taper angle φ6. Subsequently, as the etching is resumed, the FeMn film 73 can also be etched into a shape close to the perpendicular (FIG. 17C). At this time, the FeMn film 73 has a taper angle φ7 (φ6<φ7). In this manner, the first etching and the immediately following removal of the deposition material, as well as the second etching and the immediately following removal of the deposition material result in a substantial tapered mask comprised of the films 73–76, the taper angle of which changes halfway, as illustrated in FIG. 17C. By using such a substantial tapered mask comprised of the films 73 77, the etched materials 71, 72 can be formed with a taper angle φ8 close to the perpendicular in the stacked films of the MRAM and the like (here, φ6<φ7<φ8).

The ferromagnetic material may be prevalently Fe, Co, Ni, Nn or a compound thereof, which are all known as hardly-etched materials. In FIGS. 17B–17D, a mask 77 is also shown.

The foregoing example has been taken for explaining a method of creating a mask shape or a substantial tapered mask shape for forming an etched material with a substantially perpendicular side wall. A method according to the present invention explained below relies on a change in etching conditions to provide an etched material with a substantially perpendicular side wall.

As described above, the taper angle of an etched material is determined by the ratio rd/re of a deposition rate rd to a side wall of the etched material to an etching rate re to the bottom of the etched material. As the ratio rd/re is smaller, the taper angle of the side wall of the etched material can be brought closer to the perpendicular.

In the foregoing embodiments, the etching is conducted in conditions which make the deposition material difficult to attach to the wall of the vacuum chamber (104 in FIG. 3), but a reduction in the concentration of a reaction product in the vacuum chamber is effective for reducing the attachment of the deposition material. Under conditions in which no deposition material attaches to the wall of the vacuum chamber, a reduction in the concentration of a reaction product in a vapor phase can relay only on exhaustion of the reaction product in the vapor phase out of the vacuum chamber, or on forced attachment of the reaction product onto side walls of a mask and an etched material. Therefore, actually, the concentration of the reaction product in the vapor phase is maintained high under the conditions in which no deposition material attaches to the wall of the vacuum chamber.

However, it is possible to make the reaction product readily attach to the wall of the vacuum chamber 104 in FIG. 3 by reducing the impedance of the load (heater) 115 to reduce a current flowing an electrostatically coupled antenna 118. In this event, since the reaction product in the vapor phase attaches to the wall of the vacuum chamber, and its concentration is reduced accordingly, a reduction is achieved in the amount of the reaction product attaching to a wafer from the vapor phase. As a result, a less amount of deposition material is deposited on the side walls of the mask and etched material, so that the etched material can be formed with the side wall close to the perpendicular, even using a mask having a side wall angled substantially at 90 degrees.

However, if the deposition material attaches to the wall of the vacuum chamber, this will cause a change in the state of a plasma, and the generation of particles, so that the deposition material must be periodically removed from the wall. Specifically, a deposition material removal process (i.e., increasing the current flowing the electrostatically coupled antenna 118) is performed each time one or a plurality of wafers have been processed.

In this event, the deposition material may be rapidly exhausted out of the vacuum chamber 104 by increasing the temperature of the wafer base (sample base) 109 from that during etching to prevent the deposition material from attaching to the wafer base 109. On the contrary, the temperature of the wafer base 109 may be reduced to allow the deposition material to actively attach to the wafer base 109 or a wafer carried on the wafer base 109, to prevent the deposition material from reflecting from the wafer base 109 or the wafer carried on the wafer base 109, such that the deposition material is prevented from again attaching to the wall of the vacuum chamber to promote the exhaustion of the deposition material.

According to the present invention, for etching a material which is hard to form with a perpendicular side wall, the etched material can be formed with a side wall close to the perpendicular by the use of a tapered mask, thereby fabricating high performance semiconductor devices or highly integrated semiconductor devices.

It should be further understood by those skilled in the art that the foregoing description has been made on embodiments of the invention and that various changes and modifications may be made in the invention without departing from the spirit of the invention and the scope of the appended claims.

What is claimed is:

1. A plasma-based method of etching a film of hardly-etched material formed on a substrate using said film and a mask formed on said hardly-etched film, said method comprising the step of:

etching said film of hardly-etched material using said mask having a side wall which surface forms an angle of substantially θ with respect to surface of said substrate, said θ being given by tan φ=(re−rd)/((rd−re×cosθ)×sinθ) supporting that said Φ is a target tapered angle of said film of hardly-etched material after being etched, wherein re is an etching rate of said film of hardly-etched material and rd is a deposition rate of reaction product to said side well.

2. An etching method according to claim 1, wherein:

said film is one selected from the group of materials consisting of Fe, Co, Mn, Ni, Pt, Ru, RuO2, Ta, Ir, IrO2, Os, Pd, Au, Ta2O5, PZT, BST, SBT, Al2O3, HfO2, ZrO2, GaAs and ITO.

3. A plasma-based method of etching a film of hardly-etched material formed on a substrate using said film and a mask formed on said hardly-etched film, said method comprising the step of:

etching said film of hardly-etched material using said mask having a side wall formed with a taper angle of substantially θ with respect to surface of said substrate, to form etched film with a taper angle with respect to the surface of said substrate equal to or larger than the taper angle of said mask, said θ being given by tan Φ=(re−ed)/((rd−re×cosθ)×sinθ). wherein said φ is a target tapered angle of said film of hardly-etched material after being etched, re is an etching rate of said film of hardly-etched material end rd is a deposition rate of reaction product to said side wall.

4. A plasma-based method of etching a film of hardly-etched material formed on a substrate using said film and a mask formed on said hardly-etched film, said method comprising the steps of:

forming said mask such that a side wall of said mask has a taper angle of substantially θ with respect to the surface of said substrate, said θ being given by tan Φ=(re−rd)/((rd−re×cosθ)×sinθ); and etching said film of hardly-etched material using said mask, wherein said Φ is a target tapered angle of said film of hardly-etched material after being etched, re is an etching rate of said film of hardly-etched material and rd is a deposition rate of reaction production to said side wall.

5. A method of etching a film of hardly-etched material according to claim 4, wherein:

said film is one selected from the group of materials consisting of:

Fe, Co, Mn, Ni,

Pt, Ru, RuO2, Ta, Ir, IrO2, Os, Pd, Au, Ti, TiOx, SrRUO3, (La, Sr)CoO3, Cu(Ba, Sr)TiO3, SRO: SrTiO3, BTO: BaTiO3, SrTa2O6, Sr2Ta2O7, ZnO, Al2O3, ZrO2, HfO2, Ta2O5, Pb(Zr, Ti)O3, Pb(Zr, Ti)Nb2O8, (Pb, La)(Zr, Tl)O3, PbTiNbOx, SrBi2Ta2O9, SrBi2(Ta, Nb)2O9, Bi4Ti3O12, BiSiO$_x$, Bi$_{4-x}$La$_x$Ti $_3$O$_{12}$, and InTiO.

6. A method of etching a film of hardly-etched material according to claim 4, wherein:

said step of forming said mask includes the step of etching said mask.

7. A method of etching a film of hardly-etched material according to claim 6, wherein;

said step of etching said mask includes the step of adjusting at least one of a thickness of said film and an etching time for said mask to adjust the taper angle of said mask.

8. A method of etching a film of hardly-etched material according to claim 6, wherein:

said step of etching said mask includes the step of adjusting at least one of the size of a photoresist mask formed on said mask, and an etching time for said mask to adjust the taper angle of said mask.

9. A method of etching a film of hardly-etched material according to claim 6, wherein:

said step of etching said mask includes the step of adjusting an etching condition for said mask to adjust the taper angle of said mask.

10. A method of etching a film of hardly-etched material according to claim 9, wherein:

said etching condition is at least one of a composition of a gas introduced into an etching chamber and an etching pressure.

11. A method of etching a film of hardly-etched material according to claim 6, wherein:

said step of etching said mask includes the steps of washing said mask in the middle of etching said mask by dry etching, and subsequently etching again said mask by wet etching.

12. A method of etching a film of hardly-etched material according to claim 11, wherein:

said step of etching said mask includes the step of adjusting at least one of the size of a photoresist mask formed on said mask, and an etching time for said mask before said step of washing to adjust the taper angle of said mask.

13. A method of fabricating a semiconductor device using at least one layer of hardly-etched material formed on a substrate, and a mask formed on said hardly-etched film, said method comprising the steps of:

performing a first etching of said layer of hardly-etched material by a predetermined amount using said mask, during which a first part of said layer exposed for the first time by said first etching is formed with a first taper angle θ with respect to a surface of said substrate;

washing out an etching product in the middle of the etching; and performing a second etching of said layer of hardly-etched material by a remaining amount using said mask, during which a second part of said layer exposed for the first time by said second etching is formed with a second taper angle of substantially Φ with respect to the surface of said substrate given by tan Φ=(re−rd)/ rd−re×cosθ)×sinθ) wherein the second taper angle is larger than the first taper angle, and wherein re is an etching rate of said film of hardly-etched material and rd is a deposition rate of reaction product to said side wall.

14. A semiconductor device fabricated by the method of manufacturing a semiconductor device according to claim 13, comprising:

a substrate; and at least one layer of hardly-etched material formed on said substrate, said layer of hardly-etched material having a side wall, the taper angle of which changes in the middle of said side wall.

15. A semiconductor device fabricated by the method of manufacturing a semiconductor device according to claim 13, comprising:

a substrate; and at least two layers of hardly-etched material formed on said substrate, wherein one of said at least two layers of hardly-etched material is formed with a side wall having a taper angle different from a taper angle of a side wall of the other layer of hardly-etched material.

16. An etching method for attaching a reaction product on an inner wall of a vacuum chamber of an etching apparatus which is arranged in a manner that a high frequency current is supplied to a coil provided on an outer peripheral portion of said vacuum chamber to generate plasma within said vacuum chamber, etching gas is introduced into said vacuum chamber through a gas introducing port and exhausted from an exhauster, and an electrostatically coupled antenna grounded through a load is provided on the outer peripheral portion of said vacuum chamber, comprising the step of:

continuously attaching said reaction product to the inner wall of said vacuum chamber until at least one wafer has been processed in a state that an impedance of said load is reduced to make an amount of current flowing into said electrostatically coupled antenna small, such that an etched material formed on a substrate within said vacuum chamber has a side well angled substantially at 90 degrees with respect to the surface of said substrate.

17. An etching method according to claim 16, further comprising the step of:

periodically removing said reaction product attached on the wall of said etching apparatus.

18. An etching method according to claim 16, further comprising the step of:

etching the etched material using a mask having a side wall angled at less than 90 degrees with respect to the surface of said substrate.

19. A method of etching a material under processing using a semiconductor device fabricating apparatus comprising a wafer carrier, a plurality of processing chambers and a plurality of post-processing chambers connected to said wafer carrier, a plurality of lock chambers, and an atmosphere carrier located adjacent to said lock chambers, wherein said atmosphere carrier can be connected to said plurality of lock chambers, and a wafer cassette adjacent to said atmosphere carrier, said method comprising the steps of:

etching the material under processing in one of said plurality of processing chambers;

post-processing the material under processing in one of said plurality of post-processing chambers thereby to remove deposition material from a side wall of the material under processing;

etching the material in one of said plurality of processing chambers; and post-processing the material under processing in one of said plurality of post-processing chambers.

20. A method of etching a material under processing using a semiconductor device fabricating apparatus comprising a wafer carrier, a plurality of processing chambers connected to said wafer carrier, a plurality of lock chambers, and an atmosphere carrier located adjacent to said lock chambers, wherein said atmosphere carrier can be connected to said plurality of lock chambers, a post-processing chamber adjacent to said atmosphere carrier, and a wafer cassette adjacent to said atmosphere carrier, said method comprising the steps of:

etching the material under processing in one of said plurality of processing chambers;

post-processing the material under processing in said post-processing chamber thereby to remove deposition material from a side wall of the material under processing;

etching the material in one of said plurality of processing chambers; and post-processing the material under processing in said post-processing chamber.

21. A plasma-based method of etching a film of hardly-etched material formed on a substrate using said film and a mask formed on said hardly-etched film, said method comprising the step of:

etching said film of hardly-etched material using said mask having a side wall which surface forms an angle of substantially $\theta$ with respect to a surface of said substrate, said $\theta$ being a root given by $\tan \Phi = (re-rd)/((rd - re \times \cos\theta) \times \sin\theta)$ supposing that said $\Phi$ is a maximum value of a target tapered angle of said film of hardly-etched material after being etched, wherein re is an etching rate of said film of hardly-etched material and rd is a deposition rate of reaction product to said side wall.

* * * * *